United States Patent
Nakamura

(10) Patent No.: US 6,645,827 B2
(45) Date of Patent: Nov. 11, 2003

(54) METHOD FOR FORMING ISOLATION REGIONS ON SEMICONDUCTOR DEVICE

(75) Inventor: Toshiyuki Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/874,223

(22) Filed: Jun. 6, 2001

(65) Prior Publication Data

US 2002/0076901 A1 Jun. 20, 2002

(30) Foreign Application Priority Data

Dec. 14, 2000 (JP) ........................................ 2000-379553

(51) Int. Cl.[7] ............................................... H01L 21/76
(52) U.S. Cl. ...................... 438/452; 438/439; 438/762; 438/770; 438/773
(58) Field of Search ................................. 438/439, 452, 438/761, 762, 770, 773

(56) References Cited

U.S. PATENT DOCUMENTS 5,151,381 A    9/1992  Liu et al.
5,637,528 A    6/1997  Higashitani et al.
5,985,738 A  * 11/1999  Jang et al. .................. 438/452
6,221,789 B1 *  4/2001  Arghavani et al. .......... 438/763

FOREIGN PATENT DOCUMENTS

JP    10-209268   *  8/1998
JP    10-335445   * 12/1998

* cited by examiner

Primary Examiner—Eddie Lee
Assistant Examiner—N. Drew Richards
(74) Attorney, Agent, or Firm—Volentine Francos, PLLC

(57) ABSTRACT

A method for forming isolation regions on a semiconductor substrate, includes partially covering the surface of the semiconductor substrate with oxidation inhibiting films, and heat-treating the portions of the semiconductor substrate which are exposed from the oxidation inhibiting films. The heat treatment consists of a wet-type heating step in a gaseous atmosphere containing oxygen and hydrogen, and a dry-type heating step in a atmosphere without hydrogen which is performed after the wet-type heating step.

26 Claims, 3 Drawing Sheets

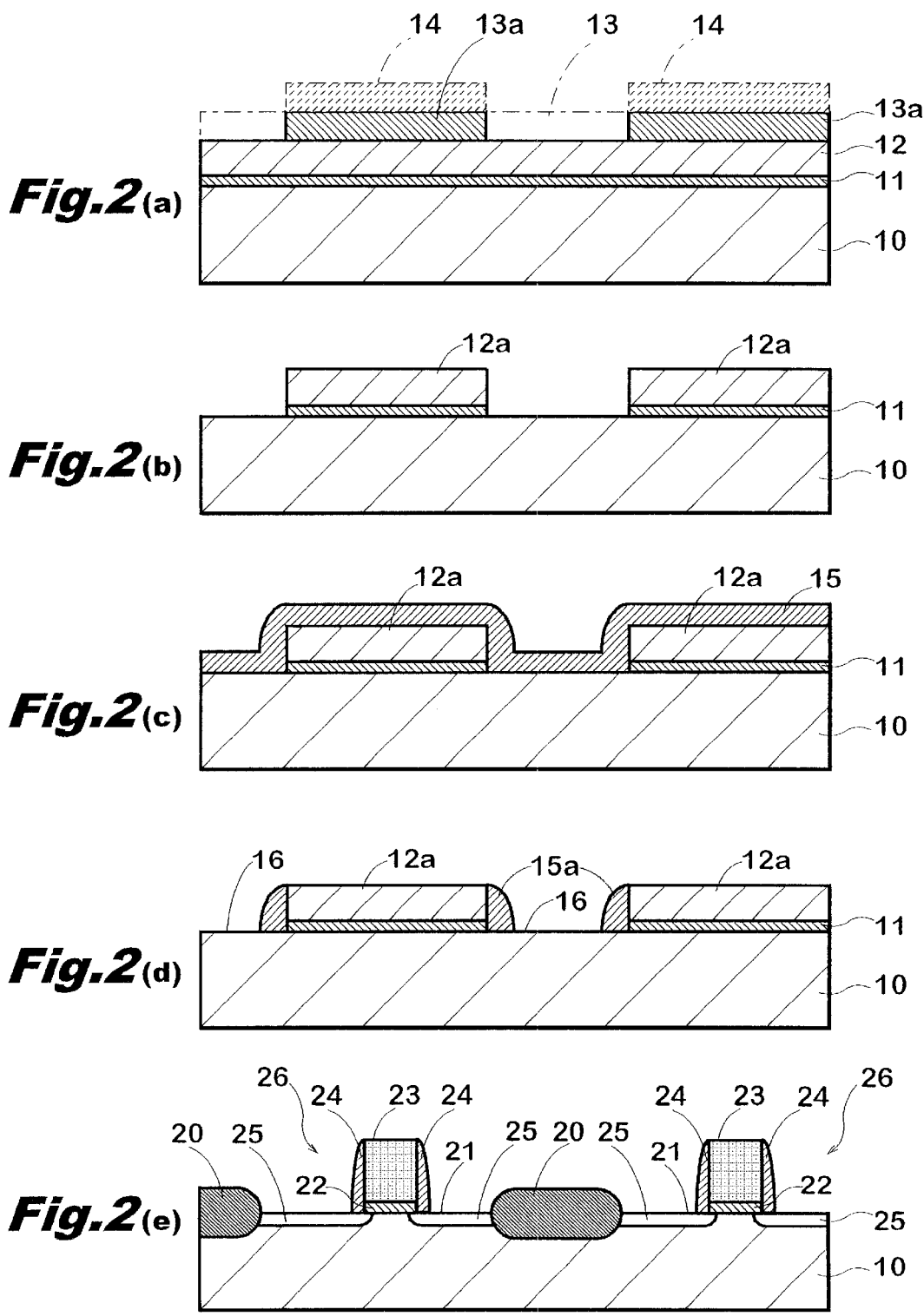

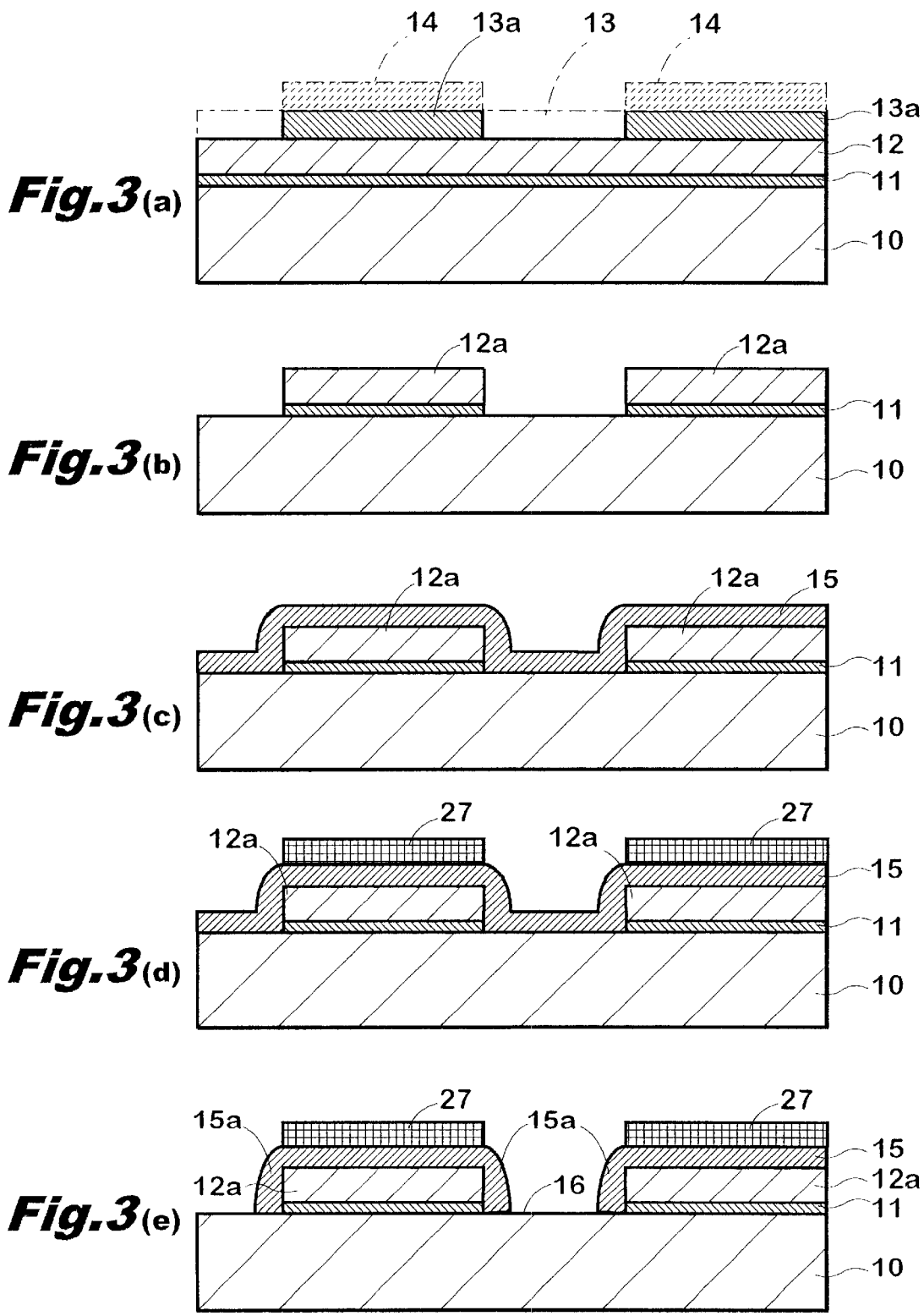

METHOD FOR FORMING ISOLATION REGIONS ON SEMICONDUCTOR DEVICE

BACKGROUND OF THE INVENTION

1. Field of the Invention

The present invention relates to a method for manufacturing a semiconductor device, such as a semiconductor integrated circuit, and more particularly to a method for forming isolation regions to delimit active regions on a semiconductor substrate.

2. Prior Art

To mutually electrically isolate the active regions, in which semiconductor devices such as transistors are formed, on a silicon semiconductor substrate, for example, isolation regions made of silicon oxide are generally formed, and semiconductor devices are formed as required in the active regions delimited by the isolation regions.

The LOCOS isolation process is one of the above-mentioned methods for forming isolation regions. According to this process, under the condition that the surface of a silicon semiconductor substrate is partially covered with a patterned oxidation inhibiting film, such as silicon nitride, and partially exposed through the openings of the oxidation inhibiting film, the regions of the surface of the semiconductor substrate exposed from the oxidation inhibiting film can be oxidized by heat treatment and the isolation regions are formed by the field oxide films of silicon oxide produced by the above-mentioned oxidation process Meanwhile, with the progress of the scaledown of the isolation regions accompanying the miniaturization of the electronic devices, the regions exposed from the oxidation inhibiting film decrease, for which reason the field oxide film sometimes could not be grown sufficiently in the exposed regions.

This is considered because the floating particles of the oxidation inhibiting film, removed in the plasma etching process of patterning the oxidation inhibiting film, are liable to accumulate on the exposed areas of the substrate.

In the so-called FLOCOS (Flamed LOCOS) process, side-walls are formed at the edge portions of the openings patterned in the oxidation inhibiting film, a fact which enables finer patterns to be formed in the oxidation inhibiting film than are specified in the design rule for patterning of the oxidation inhibiting films. Therefore, it is possible to obtain smaller isolation regions than are specified in the pattern design rule but; on the other hand, particles of the unnecessary side-wall material removed by plasma etching during the formation of the side-wall parts tend to be re-deposited on the exposed surface, making it difficult for a field oxide film to be grown sufficiently.

The present invention has as its object to provide a method for forming isolation regions at higher yield than in the prior art.

SUMMARY OF THE INVENTION

According to a first aspect of the present invention, a first method for forming an isolation region made of a field oxide film generated by performing a thermal oxidation process on an exposed region of the surface of a semiconductor substrate revealed through an opening of an oxidation inhibiting film under the condition that the above-mentioned surface is partially covered by the oxidation inhibiting film. The above-mentioned thermal oxidation process comprises a first heat treatment in a gaseous atmosphere containing oxygen and hydrogen, and a second heat treatment subsequent to the first heat treatment in a gaseous atmosphere with the supply of hydrogen stopped.

In the first heat treatment, heat treatment is carried out in a gaseous atmosphere containing oxygen and hydrogen. Therefore, the moisture produced by interaction between oxygen and hydrogen further reacts with the oxide film inhibiting substance accumulated on the exposed surface of the substrate, thereby decomposing the oxide film inhibiting substance, which is re-deposited. To prevent the progression of irregularities that occur due to the decomposition of the oxide film inhibiting substance, the first heat treatment is switched to the second heat treatment that is performed in an oxygen atmosphere, which has conventionally been used.

By performing a combination of the first heat treatment attended by moisture production and the second heat treatment at a higher temperature with no production of moisture, a field oxide film can be grown securely and irregularities, such as the white ribbon phenomenon, can be inhibited from developing. Thus, it becomes possible to form an isolation region by a suitably minuscule field oxide film.

Hydrogen can be added as a supplementary substance to the oxygen, and after the side-wall parts have been formed at the edge portions of the oxidation inhibiting film, thermal oxidation can be applied to the FLOCOS (Flamed LOCOS) mentioned above.

With regard to forming the side-wall parts, as in the conventional Flamed LOCOS, after the oxidation inhibiting film partially covering the surface of the semiconductor substrate, the side-wall parts can be formed by depositing a side-wall material on the oxidation inhibiting film and on the region of the above-mentioned surface which is exposed through an opening of the oxidation inhibiting film, and by removing the unwanted side-wall material that builds up on the oxidation inhibiting film and on the exposed region of the semiconductor substrate by plasma etching, leaving behind the side-wall parts at the edge portions of the oxidation inhibiting film.

Preferably, the first and second heat treatments are carried out in a single heating furnace to prevent the process from becoming complicated and also to prevent exposure to the atmospheric air to thereby securely preclude insulation deterioration, which may be caused by entry of foreign substances into the field oxide film.

According to a second aspect of the present invention, a second method for forming an insulation region made of a field oxide film, comprises partially covering the surface of a semiconductor substrate with an oxidation inhibiting film; depositing a side-wall material on said oxidation inhibiting film and on an exposed region of said surface, revealed through an opening of said oxidation inhibiting film, to form side-wall parts at edge portions of said oxidation inhibiting film by a material having the same function as said oxidation inhibiting film; forming a protective film on that region of the deposited material corresponding to said oxidation inhibiting film; removing, by a plasma etching process, unnecessary portions of said side-wall material exposed from said protective film, to form said side-wall parts by said deposited; and heat-treating said surface partially exposed between said side-wall parts to grow a field oxide film.

According to the second method, when removing, by plasma etching, unwanted portions of the side-wall material deposited on the oxidation inhibiting film and on the exposed region of the surface not covered by the overlying oxidation inhibiting film, because the protective film on the deposited side-wall parts protects the side-wall material under the protective film from attack by the plasma etching process, a large amount of side-wall material is prevented from scattering in the atmospheric gas in the plasma etching process as in the prior art, and the suppression of the growth of the field oxide film caused by the re-deposition of the scattering material can be prevented, which used to occur in conventional heat treatment in the prior art.

The oxidation inhibiting film and the protective film are preferably formed by a photolithographic technique using the same mask for simplicity and accuracy of the process.

BRIEF DESCRIPTION OF THE DRAWINGS

FIG. 2(a)~FIG. 2(e) show a manufacturing process diagram showing the first method for forming an isolation region according to the present invention; and FIG. 3(a)~FIG. 3(e) show a manufacturing process diagram showing the second method for forming an isolation region according to the present invention.

DESCRIPTION OF PREFERRED EMBODIMENTS

Figure 1:
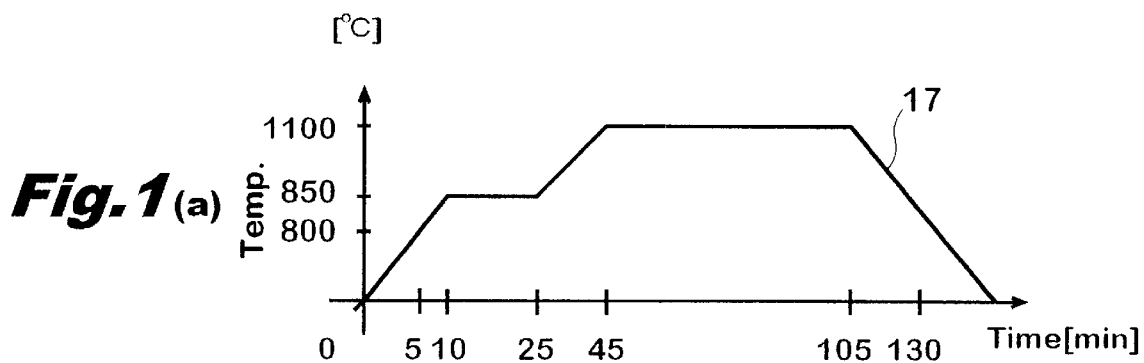
FIG. 1(a)~FIG. 1(c) are explanatory diagrams showing the conditions of heat treatment in the first method for forming an isolation region according to the present invention.
Figure 1:
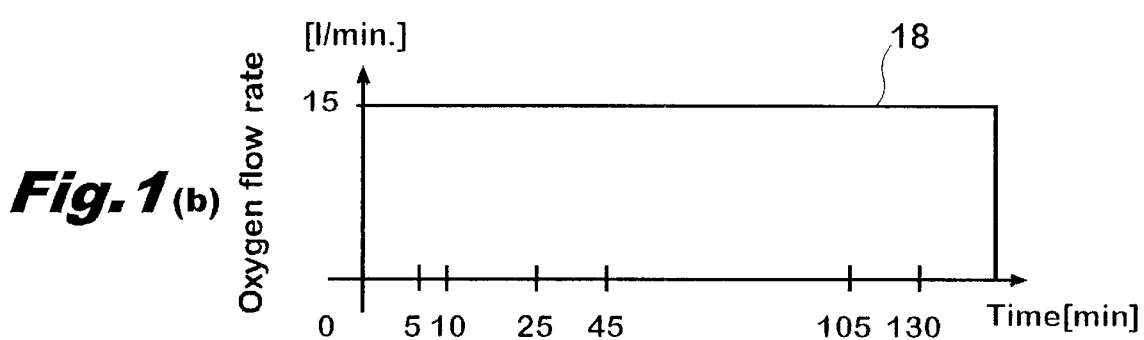
Figure 1:
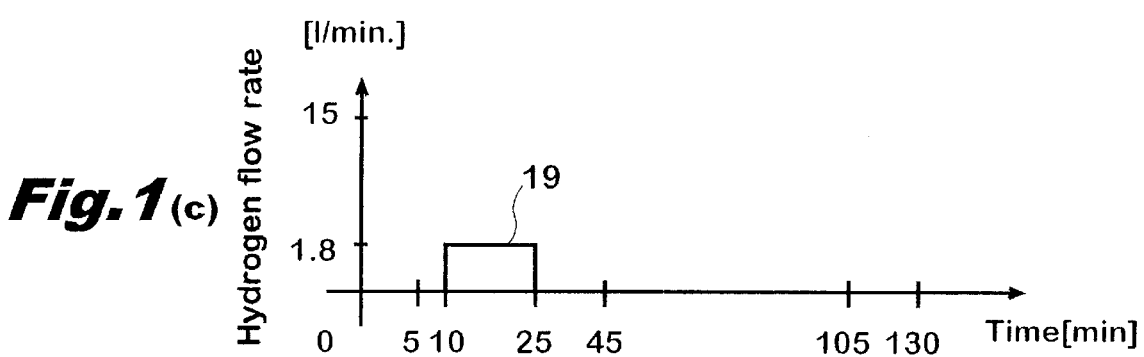

Description will now be made in detail of preferred embodiments of the present invention, illustrated in the drawings.

<Embodiment 1>

FIG. 1(a)~FIG.(c) are explanatory diagrams of heat treatment conditions that are used in the first method for forming an isolation region according to the present invention. Before moving on to the description of the heat treatment conditions, description will be made of the sequential process steps of the first forming method of an isolation region in the present invention while referring to FIG. 2(a)~FIG. 2(e).

As shown in FIG. 2(a), a pad film 11 of silicon oxide is formed by thermal oxidation on the surface of a semiconductor substrate 10 made of a silicon crystal substrate, for example. A silicon nitride layer 12 is formed on the pad film 11 by lower pressure CVD, for example. As is well known, the pad film 11 lessens a distortion caused by a thermal expansion difference between the substrate 10 and the silicon nitride layer 12 covering the surface of the substrate 10 during heat treatment of the substrate 10, which will be described later.

As a means to form an etching mask used in a selective etching process to etch the pad film 11 and the silicon nitride layer on the substrate 10, a photoresist layer 13 is formed over the whole of the top surface of the silicon nitride film. The phtoresist layer 13 is subjected to selective exposure through a photomask 14 that exposes an isolation region of a desired pattern and then the photoresist layer 13 undergoes a develop process. Thus, as shown by a solid line in FIG. 2(a), by the develop process, the photoresist layer 13 has its region, which corresponds to the photomask 14, removed and becomes an etching mask 13a to expose the region of the substrate which is used as the isolation region.

By a well-known plasma etching process using this etching mask 13a, the unnecessary portions of the pad film 11 and the silicon nitride layer 12 which are exposed from the etching mask 13a are removed and then the etching mask 13a is removed. Consequently, as shown in FIG. 2(b), silicon nitride films 12a, which partially expose the surface of the substrate 10, are formed on the substrate 10 with interposition of the pad films 11.

After the formation of the silicon nitride films 12a, through an opening of which is exposed a region where an isolation region is to be formed, the side-wall parts are formed onto the silicon nitride films 12a in an example shown in FIG. 2(a)~FIG. 2(e).

As shown in FIG. 2(c), to form the side-wall parts, by using a well-known CVD method, a layer 15 of silicon nitride (Si3N4), which is identical in material to the silicon nitride films 12a, is newly deposited on the silicon nitride films 12a and on the region of the substrate which is exposed between the overlying silicon nitride films 12a.

After the silicon nitride film 15 used as the side-wall material has been deposited, a well-known anisotropic plasma etching process is carried out on the whole surface of the silicon nitride layer 15. Therefore, as shown in FIG. 2(d), the silicon nitride layer 15 deposited right on the silicon nitride films 12a and on the substrate 10 is removed and the unnecessary portions of the silicon nitride 15 on the substrate surface are removed, except for those covering the edge portions of the silicon nitride films 12a. Thus, the side-wall parts 15a are formed covering the above-mentioned edge portions.

Because of the presence of the formed side-wall parts 15, a smaller region can be exposed through an opening 16 defined by the side-wall parts 15a than is specified by the design rule for photolithographic techniques using the photomask 14.

The substrate 10 is heat-treated under the condition that the side-wall parts 15a are formed on the silicon nitride films 12a and that the surface of the substrate 10 is partially exposed through the opening 16 defined by the side-wall parts 15a. In this heat treatment, those regions of the substrate 10, which are located under the silicon nitride films 12a, are not oxidized as they are protected by the silicon nitride films, which suppress the growth of oxide film.

In contrast, the region of the substrate 10 exposed from the silicon nitride films, in other words, the region exposed through the opening 16 is thermally oxidized. However, when the unnecessary portions of the silicon nitride layer 15 are removed by plasma etching, if floating particles of the silicon nitride (Si3N4) in the plasma atmosphere are re-deposited on the region exposed through the opening 16 on the substrate 10, the exposed regions are prevented from being thermally oxidized in the above-mentioned heat treatment.

Heat treatment according to the present invention is performed on the substrate 10 to securely oxidize the regions on the substrate 10 exposed through the opening 16 in the substrate 10 without meeting obstruction to the thermal oxidation from the above-mentioned re-deposition of silicon nitride.

In the heat treatment in the present invention, a heating furnace with a temperature profile such as shown in FIG. 1(a) is used, and the chamber of the heating furnace accommodating the substrate 10, which is to be heated, is controlled in supply of oxygen and hydrogen as indicated by FIGS. 1(b) and 1(c).

In FIG. 1(a), the vertical axis indicates temperature (° C.) and the horizontal axis indicates time (minutes). In FIGS. 1(b) and 1(c), the vertical axis indicates gas flow rate (L/min) and the horizontal axis indicates time (minutes).

Under the condition that a substrate 10 shown in FIG. 2(d) is placed in the heating chamber of the heating furnace, the temperature of the heating furnace, in other words, the temperature of the substrate 10 in the chamber is raised along the characteristic curve 17 of the graph in FIG. 1(a) from room temperature to 850° C., the temperature of the first heat treatment.

When the temperature of the substrate 10 starts to rise toward the first heat treatment temperature from room temperature, oxygen is supplied at a flow rate of 15 L/min into the chamber in which the substrate 10 is placed. The supply of oxygen continues under the same condition until the substrate 10 returns to room temperature as indicated by the oxygen supply characteristic curve 18 in FIG. 1(b).

The substrate 10 in the chamber can be kept in a vacuum by cutting off the supply of oxygen while the temperature is rising to the first heat treatment temperature.

After about 10 min of temperature rise, when the substrate 10 reaches the first heat treatment temperature, in addition to supply of oxygen, hydrogen as a supplement to oxygen is supplied at a flow rate of about 1.8 L/min, which is about ⅛ of the flow rate of oxygen, into the heating chamber as shown by the hydrogen supply characteristic curve 19 in FIG. 1(c).

The first heat treatment is continued for about 15 minutes in an atmosphere of oxygen and hydrogen supplied.

In the first heat treatment, hydrogen and oxygen are supplied, and moisture, produced by their interaction, is contained in the heating atmosphere in the chamber. The moisture reacts with the silicon nitride floating in the air or adhering to the region of the substrate 10 exposed through the opening 16 as indicated by the reaction formula (1) as follows.

$$Si_3N_4 + 6H_2O \rightarrow 3SiO_2 + 4NH_3 \quad (1)$$

Consequently, the silicon nitride, through reaction with the moisture, is decomposed to silicon oxide and ammonia gas (NH3).

Therefore, by the reaction mentioned above, the silicon nitride adhering to the region of the substrate 10 exposed through the opening 16 is removed properly and silicon oxide gradually starts to grow.

After the first heat treatment is continued for about 15 minutes in a moisture-containing atmosphere, while the supply of hydrogen is cutoff as shown in FIG. 1(c) and only oxygen is supplied, the temperature of the substrate 10 is raised, taking about 20 minutes, to 1,100° C., the temperature of the second heat treatment.

In the process including a step of temperature elevation to the second heat treatment temperature, hydrogen is not supplied, so that the reactions in the reaction formula (1) do not take place.

The temperature may be elevated to the second heat treatment temperature in a vacuum with the supply of oxygen stopped.

When the substrate temperature is raised to the second heat treatment temperature, and maintained there for about 60 minutes.

In the second heat treatment, as described above, hydrogen is not supplied and the substrate is kept in a high-temperature oxygen atmosphere of 1100° C., for which reason the region of the substrate exposed through the opening 16 is subjected to accelerated oxidation and silicon oxide grows steadily. Consequently, as shown in FIG. 2(e), in the region that corresponds to each opening, the field oxide film 20 of silicon oxide is formed securely and effectively.

After the second heat treatment is finished, the temperature of the substrate 10 is cooled down to room temperature in the oxygen atmosphere. At this time, the substrate 10 may be brought back to room temperature in the vacuum without supplying oxygen.

After the field oxide film 20 has been formed, the silicon nitride films 12a and the pad films 11 as well as the side-wall parts 15a are removed. Subsequently, as shown in FIG. 2(e), for example, gates 23 are formed with interposition of gate oxide films 22 in active regions 21 defined by the field oxide films 20 and after side-wall parts 24 are formed, impurities are injected into both sides of each gate 23 by ion implantation, for example. To activate the impurity regions, the substrate 10 is subjected to a well-known heat treatment called RTA, whereby source/drain regions 25, 25 are formed. Thus, semiconductor devices, such as MOS transistors 26 are formed in the active regions 21.

In the first heat treatment mentioned above, an ammonia gas is produced as has been described with reference to the reaction formula (1). This excess ammonia gas produced gives rise to the white ribbon phenomenon that deteriorates the dielectric strength of the gate oxide films 22 of the MOS transistors as shown in FIG. 2(e).

To effectively suppress the occurrence of the white ribbon phenomenon, as mentioned above, the first heat treatment, which is a wet-type heat treatment in an atmosphere containing moisture, is performed at a lower temperature than the temperature of the second heat treatment, which is a dry-type heat treatment without moisture, and the first heat treatment is finished in a shorter time than the second heat treatment.

Therefore, by performing a combination of the wet-type heat treatment at a relatively low temperature and the subsequent dry-type heat treatment at a high temperature, it becomes possible to securely form the field oxide films 20 in a relatively fine pattern without incurring a deterioration in the electrical characteristics of semiconductor devices 26, such as the white ribbon phenomenon mentioned above.

The above heat treatment has been applied to the so-called flamed LOCOS process that forms the side-wall parts 15a on the silicon nitride films 12a as the oxidation inhibitors, but as shown in FIG. 2(b), the above method according to the present invention may be applied to the LOCOS process using the silicon nitride films 12a without the side-wall parts 15a.

The various heat treatment conditions, including those shown in FIGS. 1(a) to 1(c), are mere examples, and it is possible, for example, to add an inactive gas other than nitrogen, such as an argon gas to oxygen as the occasion demands, and it is also possible to suitably select temperature and process time for the first and second heat treatments.

Embodiment 2

FIG. 3(a)~FIG. 3(e) show a second method for forming an isolation region according to the present invention.

The steps shown in FIGS. 3(a) to 3(c) are the same as the steps shown in FIGS. 2(a) to 2(c).

More specifically, as shown in FIG. 3(a), after a silicon nitride layer 12 has been formed, with interposition of a pad film 11, on the surface of the substrate 10 identical with the one mentioned above, a photoresist film 13 is formed covering the top surface of the silicon nitride layer 12. The photoresist layer 13, after selectively exposed through a photomask 14, undergoes a develop step, whereby an etching mask 13a is formed, which is similar to the one mentioned above.

By a plasma etching process using the etching mask 13a, the unnecessary portions of the pad film 11 and the silicon nitride layer 12 which are exposed through the etching mask 13a are removed. Subsequently, as the etching mask 13a is removed, as shown in FIG. 3(b), silicon nitride films 12a that partially expose the surface of the substrate 10 are formed on the substrate 10 with interpositon of the pad film 11.

After this, as shown in FIG. 3(c), a layer 15 of silicon nitride (Si3N4) for forming the side-wall parts is deposited anew on the region of the substrate 10 which is exposed from the silicon nitride film 12a and on the silicon nitride film.

In the second method for forming an isolation region, after the silicon nitride layer 15 has been deposited, by using a photolithographic technique using the photomask 14 shown in FIG. 1(a), protective films 27 made of another photoresist are formed on those regions of the silicon nitride layer 15 which correspond to the underlying silicon nitride film 12 as shown in FIG. 3(d).

Using this protective film 27 as an etching mask, the silicon nitride layer 15 is etched by a plasma etching process, which is the same technique as described above as an anisotropic etching process. By this plasma etching process, the portion of the silicon nitride layer 15 which is deposited directly on the substrate 10, is removed so that the side-wall parts 15a are formed, which cover the edge portions of the silicon nitride films 12a as shown in FIG. 3(e). By the formation of the side-wall parts 15a, as has been described with reference to FIG. 2), a smaller region can be exposed through the opening 16 defined by the side-wall parts 15a than are specified in the design rule for photolithgraphy using the photomask 14.

In the plasma etching process to form the side-wall parts 15a, in other words, to form the opening 16, the regions of the silicon nitride layer 15, which mostly correspond to the the silicon nitride films 12a, are protected by the protective films 27 against the plasma etching process.

Therefore, it never occurs that such a large amount of silicon nitride floats in the plasma atmosphere as did before. For this reason, such a large amount of nitride does not adhere to the region of the substrate which is exposed through the opening 16 so as to obstruct thermal oxidation of the region.

Accordingly, after the protective film 27 is removed, by performing a well-known dry-type heat treatment on the substrate 10 in an oxygen atmosphere, a field oxide film 20 can be grown suitably on the region exposed between the side-wall parts 15a as shown in FIG. 2(e).

Instead of the dry-type heat treatment, it is possible to adopt the heat treatment in the first method for forming an isolation region, which includes a wet-type heat treatment and a dry-type heat treatment.

In the foregoing, the present invention has been described with reference to a case where a silicon crystal substrate is used. However, the present invention is not limited to this example, but may be applied to various kinds of semiconductor substrate that can be transformed by thermal oxidation into an insulating material. Further, the oxidation inhibiting film is not limited to the silicon nitride film mentioned above, but various kinds of material may be adopted, which inhibit thermal oxidation of the semiconductor substrate.

According to the present invention, as mentioned above, by performing a thermal oxidation process consisting of the first heat treatment in a moisture-containing atmosphere and the second heat treatment in an atmosphere without moisture, the oxidation inhibiting film components can be suitably prevented from being re-deposited that would suppress the growth of the field oxide film and the isolation regions made of such a field oxide film that does not decrease in dielectric strength can be formed on the minuscule regions of the semiconductor surface which are exposed from the oxidation inhibiting film.

According to the present invention, as has been described, the protective films on the side-wall material deposited on the oxidation inhibiting films and on the regions of the substrate surface exposed from the oxidation inhibiting film protect the side-wall material under the protective films from the plasma etching process of forming the side-wall parts. Therefore, the side-wall material is prevented from scattering in large amounts in the gaseous atmosphere in the plasma etching process, which used to occur in the prior art. Further, the suppression of the growth of the field oxide film can be prevented, which used to occur before during heat treatment due to the re-deposition of the side-wall material removed. Thus, it becomes possible to suitably form the isolation regions made of field oxide film even when heat treatment of dry type is performed as in the prior art.

What is claimed is:

1. A method for forming an isolation region made of a field oxide file generated by performing a thermal oxidation process on an exposed region of a surface of a semiconductor substrate revealed through an opening of an oxidation inhabiting film under the condition that said surface is partially covered by said oxidation inhabiting film, said thermal oxidation process comprising:

a first heat treatment during which said semiconductor substrate is heated to a first temperature in a gaseous atmosphere containing oxygen and hydrogen, wherein a flow rate of hydrogen is less than a flow rate of oxygen;

heating said semiconductor substrate to a second temperature without hydrogen; and a second heat treatment after said semiconductor substrate is heated to the second temperature, said heat treatment in a gaseous atmosphere containing oxygen without hydrogen.

2. A method in claim 1, wherein said hydrogen is a supplementary addition to said oxygen.

3. A method according to claim 1, wherein said first and second heat treatments and said heating are performed after side-wall parts at edge portions of said oxidation inhabiting film have been formed.

4. A method according to claim 3, wherein said side-wall parts are formed by partially covering the surface of said semiconductor substrate with said oxidation inhibiting film, and then depositing a side-wall material on said oxidation inhibiting film and on an exposed region of said surface revealed through the opening of said oxidation inhibiting film, and subsequently removing, by plasma etching process, unnecessary portions of said side-wall material deposited on said oxidation inhibiting film and on said exposed region of said semiconductor substrate while leaving behind side-wall parts at edge portions of said oxidation inhibiting film.

5. A method according to claim 1, wherein said first and second heat treatments and said heating are carried out in a single heating furnace.

6. A method according to claim 1, wherein the flow rate of hydrogen is about ⅛ the flow rate of oxygen during said first heat treatment.

7. A method according to claim 1, wherein the flow rate of hydrogen is about 1.8 liters/minute and the flow rate of oxygen is about 15 liters/minute during said first heat treatment.

8. A method according to claim 1, wherein said first heat treatment is carried out for about 15 minutes at a temperature of about 850° C., and wherein the flow rate of hydrogen is about ⅛ the flow rate of oxygen, and said second heat treatment is carried out for about 60 minutes at a temperature of about 1,100° C..

9. A method according to claim 8, wherein the flow rate of oxygen is about 15 liters/minute and the flow rate of hydrogen is about 1.8 liters/minute during said first heat treatment.

10. A method according to claim 1, wherein said heating is in a gaseous atmosphere containing oxygen.

11. A method according to claim 1, wherein said heating is in a vacuum without oxygen.

12. A method according to claim 1, wherein nitrogen gas is added to the oxygen during said first and second heat treatments.

13. A method according to claim 1, wherein argon gas is added to the oxygen during said first and second heat treatments.

14. A method of forming a field oxide isolation region in a substrate through an opening of an oxidation inhabiting film formed on the substrate, comprising:

removing substantially all residual particles of the oxidation inhabiting film from the substrate in the opening of the oxidation inhabiting film and initiating growth of a field oxide in the opening, by a first heating treatment during which the substrate is heated to a first temperature in a gaseous atmosphere containing oxygen and hydrogen, wherein a flow rate of hydrogen is less than a flow rate of oxygen during the first heat treatment;

heating the substrate to a second temperature without hydrogen; and completing growth of the field oxide in the opening by a second heat treatment after the substrate is heated to the second temperature, the second heat treatment in a gaseous atmosphere containing oxygen without hydrogen.

15. A method according to claim 14, wherein said removing, said heating and said completing are performed after formation of sidewalls at edge portions of the oxidation inhibiting film within the opening.

16. A method according to claim 15, wherein the sidewalls are formed of a same material as the oxidation inhibiting film.

17. A method according the claim 16, wherein the sidewalls are a nitride.

18. A method according to claim 14, wherein the first heat treatment is carried out for about 15 minutes at a temperature of about 850° C., and wherein the flow rate of hydrogen is about ⅛ the flow rate of oxygen, and the second heat treatment is carried out for about 60 minutes at a temperature of about 1,100° C.

19. A method according to claim 18, wherein the flow rate of oxygen is about 15 liters/minute and the flow rate of hydrogen is about 1.8 liters/minute during the first heat treatment.

20. A method according to claim 14, wherein the flow rate of hydrogen is about ⅛ the flow rate of oxygen during the first heat treatment.

21. A method according to claim 14, wherein the flow rate of hydrogen is about 1.8 liters/minute and the flow rate of oxygen is about 15 liters/minute during the first heat treatment.

22. A method according to claim 14, wherein the first heat treatment is carried out for about 15 minutes at a temperature of about 850° C., and wherein the flow rate of hydrogen is about ⅛ the flow rate of oxygen, an the second heat treatment is carried out for about 60 minutes at a temperature of about 1,100° C.

23. A method according to claim 14, wherein said heating is in a gaseous atmosphere containing oxygen.

24. A method according to claim 14, wherein said heating is in a vacuum without oxygen.

25. A method according to claim 14, wherein nitrogen as is added to the oxygen during said first and second heat treatments.

26. A method according to claim 14, wherein argon gas is added to the oxygen during said first and second heat treatments.

* * * * *